US005629630A

United States Patent [19]
Thompson et al.

[11] Patent Number: 5,629,630
[45] Date of Patent: May 13, 1997

[54] SEMICONDUCTOR WAFER CONTACT SYSTEM AND METHOD FOR CONTACTING A SEMICONDUCTOR WAFER

[75] Inventors: Patrick F. Thompson, Chandler; William M. Williams, Gilbert; Scott E. Lindsey, Mesa, all of Ariz.; Barbara Vasquez, Austin, Tex.

[73] Assignee: Motorola, Inc., Schaumburg, Ill.

[21] Appl. No.: 395,127

[22] Filed: Feb. 27, 1995

[51] Int. Cl.$^6$ .................................................. G01R 1/06
[52] U.S. Cl. .................................. 324/754; 324/755
[58] Field of Search .......................... 324/72.5, 754, 324/765, 755, 761, 158.1, 73.1; 439/482, 824

[56] References Cited

U.S. PATENT DOCUMENTS

| | | | |
|---|---|---|---|
| 4,906,920 | 3/1990 | Huff et al. | 324/754 |
| 4,918,383 | 4/1990 | Huff et al. | 324/754 |
| 4,980,637 | 12/1990 | Huff et al. | 324/754 |
| 5,070,297 | 12/1991 | Kwon et al. | 324/754 |
| 5,148,103 | 9/1992 | Pasiecznik, Jr. | |
| 5,177,438 | 1/1993 | Littlebury et al. | 324/754 |
| 5,177,439 | 1/1993 | Liu et al. | 324/754 |
| 5,180,977 | 1/1993 | Huff | 324/754 |
| 5,264,787 | 11/1993 | Woith et al. | 324/72.5 |

OTHER PUBLICATIONS

Dennis J. Genin et al., "Probing Considerations in C-4 Testing of IC Wafers," ICMCM Proceedings 1992, pp. 124-128.
Packard Hughes Interconnect Product Brochure, 1993.

*Primary Examiner*—Vinh P. Nguyen
*Attorney, Agent, or Firm*—Aaron B. Bernstein; George C. Chen

[57] ABSTRACT

A semiconductor wafer contact system includes a base substrate (13) which has an array of raised supports (18). The array of raised supports (18) are distributed in a pattern corresponding to the pattern of electrical contacts (12) on the semiconductor wafer (10), to be contacted. In between the base substrate (13) and the wafer to be contacted (10) is a flexible circuit layer (14) including an array of electrical contacts (15) having the same pattern as the contacts (12) of the wafer and the raised supports (18). The raised supports (18) provide focused and localized force, pressing the membrane test contacts (15) against the wafer electrical contacts (12).

27 Claims, 2 Drawing Sheets

SEMICONDUCTOR WAFER CONTACT SYSTEM AND METHOD FOR CONTACTING A SEMICONDUCTOR WAFER

FIELD OF THE INVENTION

The present invention relates generally to nondestructive testing of integrated circuits (ICs), and more specifically to semiconductor wafer contact test systems and methods for contacting semiconductor wafers.

BACKGROUND OF THE INVENTION

Integrated circuits are manufactured by forming multiple layers of semiconductor materials generally with repeated and fixed patterns to develop a plurality of "dice" on a thin plane or substrate, i.e., a semiconductor wafer. The wafers are then cut into individual die for further processing and packaging. The dice must be inspected and tested to insure the quality and reliability of the final products made from the semiconductor dice. Sometimes dice are tested after they are cut into individual die from the whole wafer. However, dice may also be tested simultaneously, in groups consisting of part of a wafer or a whole wafer. Testing dice before separation is often more effective.

The testing operation is typically performed at a wafer level before the wafers are sawed apart into individual die. The testing system typically comprises a test controller, which executes and controls the test programs; a wafer dispensing system, which mechanically handles and positions the wafers for testing; a probe card, which maintains an accurate mechanical contact with the device under test (DUT) and provides an electrical interface between the test controller and the DUT. The probe card includes a printed circuit board known as the "performance board." A performance board may be designed for individualized devices or IC families. The probe card also has a plurality of test probes which are accurately positioned to coincide with the input/output (I/O) pads of the DUT.

Under control of the test controller, a set of testing signals including specific combinations of voltages and currents are generated and transmitted to the DUT via the performance board and the test probes. The output of the dice in response to the test signals are detected and transmitted by the probes to the test controller via the performance board. The voltage, current or frequency responses from the DUT are analyzed and compared with a set of predetermined allowable ranges. Dice which fail to meet the testing criteria are identified and rejected and the remainder of the test chips are accepted for further process.

A conventional type of wafer probe card consists of a set of fine styluses or probes mounted on the performance board. The probes are arranged so that their tips form a pattern identical to that of the DUT's contact pads. The other ends of the probes are soldered to the traces of the printed circuits on the performance board for further connection to the test controller. The wafer dispensing system brings the wafer to be tested to an aligned position under the probe card and raises the wafer until proper contacts are established between the probes and DUT's I/O pads.

Membrane probe technology has been developed by forming an array of microcontacts, generally known as contact bumps, on a thin and flexible dielectric film, i.e., a membrane. For each contact bump, a transmission line is formed on the membrane for electric connection to the performance board. The contact bumps are often formed by metal plating methods. The transmission lines are formed by use of photolithographic methods. Contact bumps are formed directly on the membrane, and become an integral part of the membrane probe, unlike conventional probes which require mechanical attachment of electrical contacts such as needles or blades. Contact bumps can be formed to create a large number of contacts with high probe density. Additionally, improvements in mechanical and electrical performance are realized by membrane probes because of the simplicity of configuration.

One critical prerequisite for successful I/C test by either the membrane or conventional probe cards is to establish proper electrical contact between the probes and the DUT's I/O pads. In practical testing operations, the probe card and its probe tips or the contact bumps may not be exactly coplanar with the surface of the DUT's I/O pads. Furthermore, the electrical contacts on the membrane, and the pads or other types of contacts on the semiconductor die may be somewhat fragile. It is important, therefore, that an accurate and controllable force be employed when contacting probes or membrane contacts to die contacts.

Consequently, a semiconductor wafer contact system is desirable which provides force focused only in areas desired to be contacted on the semiconductor die, thereby giving increased confidence that all desired contacts are successfully made without creating excessive force on any individual contact. Furthermore, a system is desirable which is capable of dealing with local surface irregularities and nonplanarities due to process variations, etc., of wafer pad or bump heights, or fixture contact height. Furthermore, a system is desirable which allows device testing on a group of die or at a wafer level, rather than just at an individual die level.

DETAILED DESCRIPTION OF THE DRAWINGS

Figure 1:
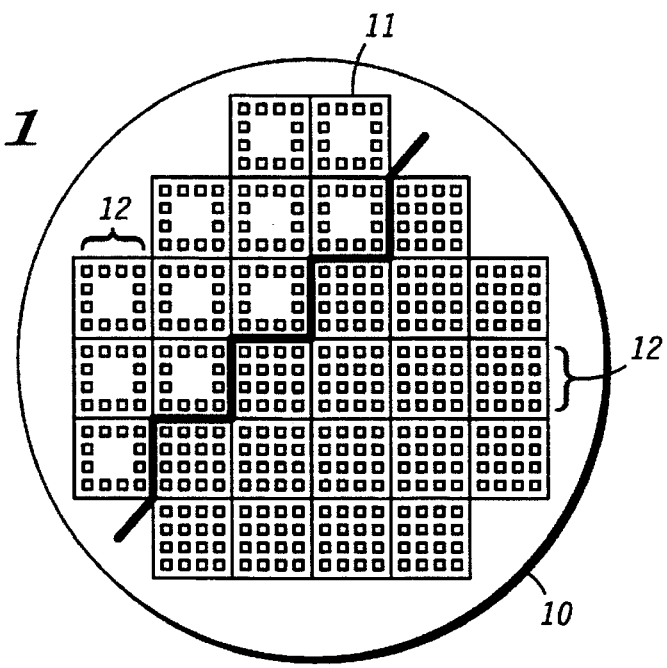
FIG. 1 is a top view of a semiconductor wafer including a plurality of semiconductor dice.

A semiconductor wafer contact system in accordance with the present invention provides both focused force and compliance in making electrical contact to an array of bumps or bond pads across a wafer, group of dice, or die. Focused force implies providing force only in areas desired to be contacted on the wafer. Focused force allows better control over force transfer, providing increased confidence that all desired contacts will be successfully made with sufficient force for good electrical contact, but without creating excessive force on any individual contact. Compliance implies the ability to deal with local surface irregularities or process variations on wafer pad or bump height, or test system contact height.

The focused force capability of a system in accordance with the present invention is provided by creating a particular surface topography in a base mechanical substrate under a flexible membrane with the test contacts. Focused force transfer requires a flexible or semi-rigid membrane. A rigid membrane is not compatible with providing focused force.

More specifically, the base mechanical substrate under the test contacts provide localized raised areas under each contact on the test membrane. Such a base mechanical substrate topography can be obtained using a variety of methods, including machining, etching and molding. The base mechanical substrate may comprise a variety of materials, including a semiconductor wafer, metal, or resin.

Such a test system scheme allows both quick prototype and low-cost high-volume fabrication of test systems for various die. Note that precise location of the force focusing features of the base mechanical substrate is not required; it is merely necessary that the raised portions are located below the contacts on the membrane, and that there are recessed areas in the base mechanical substrate between the raised portions of the base mechanical substrate. The variety of potential fabrication methods for the base mechanical substrate allow a wide choice of base materials which may be selected for different attributes such as cost, heat transfer capability and thermal coefficient of expansion match.

In a system in accordance with the present invention, compliance for dealing with surface irregularities and non planarity is provided by coating the base mechanical substrate with a compressible or compliant material. A variety of materials, such as 5 mils of polyurethane, may be applied by simple means of spraying or dipping.

In a system in accordance with the present invention, once the base mechanical substrate is fabricated, a membrane having contacts aligned to the raised portions of the base and to the electrical contacts of the die to be tested, is attached to the base. Technology for fabricating and attaching such a membrane is well known in the art. The resulting membrane-base assembly can then be placed in a fixture framed in accordance with well known methods such as adhesive beads or snap-in O rings. The fixture frame may be used to hold the wafer to be tested and membrane-base assembly together for electrical contact, and to align the test contacts to the wafer pads or bumps. The system is constructed for easy replacement of the flexible membrane. This allows long-term use of other components when the membrane becomes worn or damaged.

Turning to the FIGS. for a more detailed understanding of the preferred embodiment, FIG. 1 is a top view of an exemplary semiconductor wafer 10 including a plurality of device dice 11. Each of the plurality of dice 11 includes a plurality of electrical contacts 12, typically in the form of a grid or array. The upper left portion of the plurality of dice 11 of wafer 10 are shown having contacts 12 along their periphery. The lower right portion of the plurality of dice 11 of wafer 10 are shown having contacts 12 in a full array across each die. The different patterns are illustrative, and it will be clear to one skilled in the art than many patterns may be used, depending upon the particular application. For any pattern, the electrical contacts of each of the plurality of dice 11 combine to form a larger array of electrical contacts across the entire wafer 10.

Figure 2:
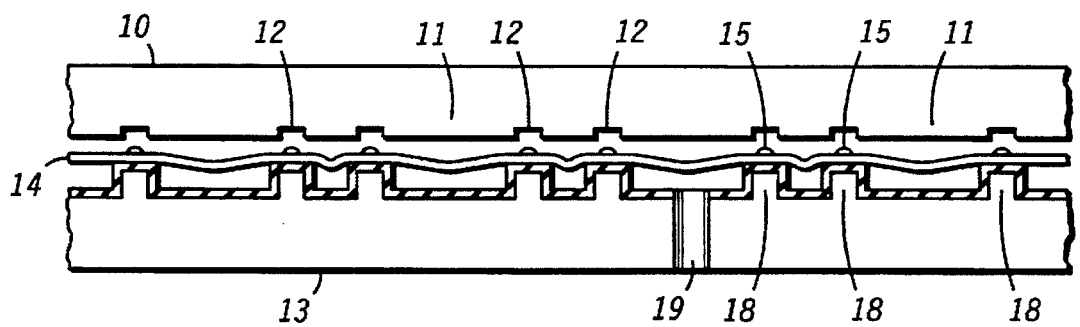
FIG. 2 is a side view cross section of an embodiment of a semiconductor wafer contact system in accordance with the present invention.

FIG. 2 is a side view cross section of a system in accordance with the present invention, illustrating important elements of the preferred embodiment. Specifically, FIG. 2 illustrates base mechanical substrate 13, also referred to as base 13 or support substrate 13. Overlying base mechanical substrate 13 is flexible membrane 14, also referred to as flexible circuit layer 14 or circuit layer 14. As explained above, flexible membrane 14 includes electrical contacts 15, which are shown as bumps 15, but could be pads where the contacts on wafer 10 are bumps. Also as discussed previously, those of ordinary skill in the art will recognize that transmission lines are formed on the membrane for electrical connection to an external performance board and test system control.

Overlying flexible membrane 14 is semiconductor wafer 10. Semiconductor wafer 10 comprises dice 11 which include electrical contacts 12. In the embodiment shown, the die electrical contacts 12 comprise metallized pads which are slightly recessed into the surface of wafer 10 due to the fact that other areas of wafer 10 are coated with passivation. It will be recognized by those skilled in the art that a variety of other types of electrical contacts may be provided, including electrically conductive bumps.

Returning to a discussion of base mechanical substrate 13, base mechanical substrate 13 includes a grid of raised supports 18. In the embodiment shown, the grid of raised supports 18 comprise an array of ridges 18. The array of ridges 18 may be fabricated according to well known methods as discussed above. For example, base mechanical substrate 13 may comprise an etched silicon substrate, a molded substrate, or a machined substrate. The array of ridges 18 are arranged to align to the corresponding array of electrical contacts or bumps 15. The array of electrical contacts 15 is also referred to as a grid of electrical contacts 15.

The grid of raised supports 18 and array of electrical contacts 15 are also aligned to the corresponding array of electrical contacts 12 on die 11 of wafer 10. Consequently, when the test system in accordance with the present invention is employed, the array of ridges 18 provides individual localized and focused force, pushing the array of bumps 15 of membrane 14 against contacts 12, thereby making contact so that electrical tests may be carried out.

Figure 3:
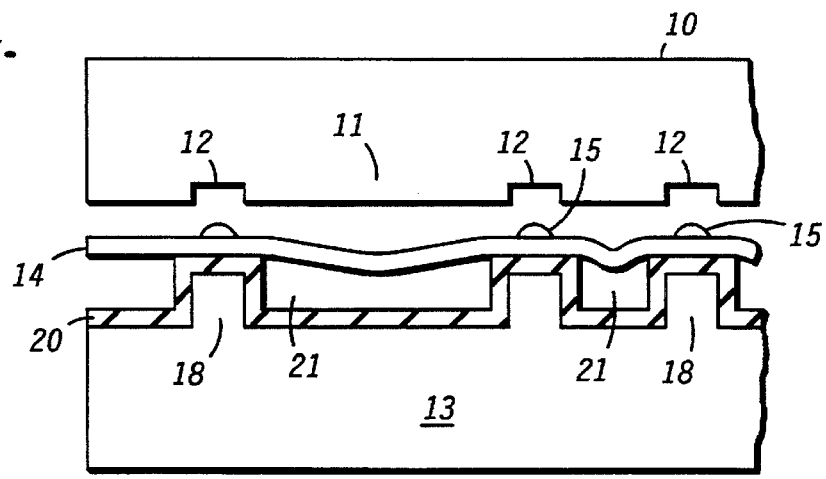
FIG. 3 is an enlarged view of a portion of the system shown in FIG. 2.

FIG. 3 is an enlarged view of a portion of the system shown in FIG. 2. The enlarged view provides better detail of certain advantageous features of the system in accordance with the present invention. More specifically, FIG. 2 illustrates compliant coating 20 overlying base mechanical substrate 13. As discussed above, compliant coating 20 may comprise materials such as polyurethane, and may be applied to mechanical substrate 13 according to a variety of well known methods including spraying and dipping. Compliant layer 20 provides the advantages of compliance explained above. That is, compliant layer 20 compresses as necessary to account for local surface irregularities or variations of membrane contacts 15, die contacts 12, raised supports 18, etc.

Another advantageous feature illustrated particularly well in FIG. 3 is recesses 21, also referred to as recessed regions 21. Recessed regions 21 inherently separate raised supports 18. Recessed regions 21 allow portions of membrane 14 to bow, when the system is being compressed during testing. This bowing allows further compensation for system component variations. For example, since recessed regions 21 allow membrane 14 to bow, lateral forces along membrane 14 are reduced. To insure that the membrane flexes toward the mechanical substrate instead of the wafer under test, an orifice 19 is optionally fashioned in the substrate, through which a vacuum is drawn. In this case, the membrane 14 will remain attached to, and aligned with, the mechanical substrate 13 regardless of the orientation of the mechanical substrate 13. Additionally, variations in temperature coefficient of expansion between mechanical substrate 13, membrane 14 and wafer 10 are accommodated by the recessed regions 21 which allow bowing.

Figure 4:
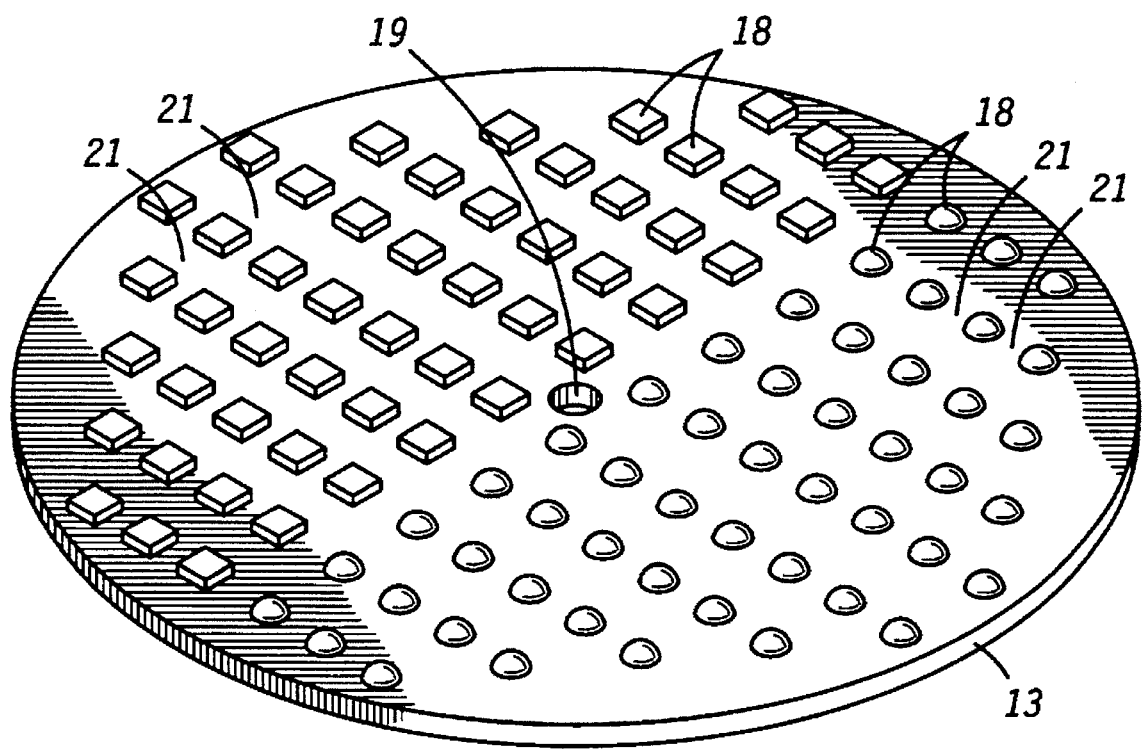
FIG. 4 is a perspective view illustrating exemplary configurations of the base mechanical system in accordance with the present invention.

FIG. 4 is a perspective view illustrating exemplary configurations of base mechanical substrate 13. Although in the actual system, raised supports 18 have the same array pattern as contacts 12 of wafer 10, FIG. 4 shows a simplified pattern for clarity and explanation purposes. In FIG. 4, the left hand portion of mechanical substrate 13 illustrates raised supports 18 as an array of raised surfaces having flat sides as may result from machining. The right hand side of mechanical substrate 13 illustrates raised supports 18 as bumps, as may result from etching, plating, etc. Those skilled in the art will recognize that a variety of configurations could be employed, depending upon the particular application. Regardless of the particular configuration, preferably supports 18 are coated with compliant layer 20, discussed in detail above.

Accordingly, in view of the features and details discussed above, it will be apparent that a system in accordance with the present invention provides advantageous focused force and surface compliance for contacting and testing semiconductor die across the surface of the semiconductor wafer. Although a particular preferred embodiment has been shown and described, modifications and improvements will occur readily to those skilled in the art. It should be understood, therefore, that this invention is not limited to the particular form shown and described, and it is intended that the appended claims cover all modifications that do not depart from the spirit and scope of the invention.

We claim:

1. A semiconductor wafer contact test system comprising:
   a flexible membrane comprising a first plurality of electrical contacts; and
   a support substrate pressing against the flexible membrane, the support substrate comprising a grid of raised supports, each of the first plurality of electrical contacts aligned to a separate one of the raised supports.

2. The system of claim 1, wherein the support substrate includes a compliant coating on a surface of the support substrate facing the flexible membrane.

3. The semiconductor wafer contact test system of claim 1, wherein the first plurality of electrical contacts comprises electrically conductive bumps.

4. The system of claim 1, wherein the support substrate further comprises a plurality of recesses separating the raised supports, the recesses permitting a plurality of portions of the flexible membrane to bow into the recesses.

5. The semiconductor wafer contact test system according to claim 1, wherein the semiconductor wafer contact test system tests a plurality of dice distributed in a first surface of a semiconductor wafer, each of the plurality of dice comprising a second plurality of electrical contacts, each of the second plurality of electrical contacts aligned to a separate one of the raised supports and to a separate one of the first plurality of electrical contacts.

6. A semiconductor wafer contact test system comprising:
   a base including a grid of raised supports;
   a compliant layer overlying the grid of raised supports; and
   a removable flexible circuit layer overlying the compliant layer, the removable flexible circuit layer including a grid of electrical contacts, each of the grid of electrical contacts aligned to a different one of the grid of raised supports.

7. The system of claim 6, wherein the base comprises an etched silicon substrate.

8. The system of claim 6, wherein the base comprises a machined substrate.

9. The system of claim 6, wherein the base comprises a molded substrate.

10. The system of claim 6, wherein the compliant layer comprises polyurethane.

11. The semiconductor wafer contact test system of claim 6, wherein the base further includes a plurality of recessed regions between the raised supports, the recessed regions permitting portions of the removable flexible circuit layer to bow into the recessed regions.

12. The semiconductor wafer contact test system according to claim 6, wherein the semiconductor wafer contact test system tests a semiconductor wafer having a third grid of electrical contacts, each of the first grid of raised supports aligned to a different one of the third grid of electrical contacts.

13. A semiconductor wafer contact test system comprising:
   a base including a grid of raised supports wherein the base includes a vacuum orifice;
   a compliant layer overlying the grid of raised supports; and
   a removable flexible circuit layer overlying the compliant layer, the removable flexible circuit layer including a grid of electrical contacts, each of the grid of raised supports aligned to a different one of the grid of electrical contacts.

14. A semiconductor wafer contact test system comprising:
   a base substrate including a first array of ridges separated from one another by respective recessed regions; and
   a circuit layer overlying the base substrate, the circuit layer comprising a second array of electrical contacts, each of the first array of ridges aligned to only one of the second array of electrical contacts.

15. The semiconductor wafer contact test system of claim 14, further comprising a compliant coating on the base substrate, the compliant coating located between the base substrate and the circuit layer.

16. The system of claim 14, wherein the second array of electrical contacts comprises protruding bumps.

17. The system of claim 14, wherein the first array of ridges is machined.

18. The system of claim 14, wherein the first array of ridges is etched.

19. The system of claim 14, wherein the first array of ridges is molded.

20. The system of claim 14, wherein the base substrate comprises silicon.

21. The semiconductor wafer contact test system according to claim 14, wherein the semiconductor wafer contact test system tests a semiconductor wafer comprising a third array of electrical contacts, each of the first array of ridges aligned to only one of the third array of electrical contacts.

22. A method for contacting a semiconductor wafer, the method comprising the steps of:
   providing a flexible membrane comprising a first plurality of electrical contacts; and
   pressing a support substrate against the flexible membrane, the support substrate comprising a grid of raised supports, each of the first plurality of electrical contacts aligned to a separate one of the raised supports.

23. The method according to claim 22 further comprising:
   providing a plurality of dice distributed in a surface of the semiconductor wafer, each of the plurality of dice comprising a second plurality of electrical contacts;

aligning the second plurality of electrical contacts to the grid of raised supports and to the first plurality of electrical contacts; and testing the plurality of dice.

24. A method of manufacturing a semiconductor device comprising:

providing a base including a grid of raised supports;

covering the grid of raised supports with a compliant layer;

providing a removable flexible circuit layer overlying the compliant layer, the removable flexible circuit layer including a grid of electrical contacts, each of the grid of electrical contacts aligned to a different one of the grid of raised supports; and pressing the grid of raised supports towards the grid of electrical contacts.

25. The method according to claim 24, further comprising the steps of:

situating the semiconductor wafer adjacent to the removable flexible circuit layer, the semiconductor wafer including a different grid of electrical contacts, the grid of raised supports aligned to the different grid of electrical contacts;

pressing the grid of electrical contacts towards the different grid of electrical contacts; and electrically testing the semiconductor wafer.

26. A method of contacting a semiconductor wafer, the method comprising the steps of:

providing a base substrate including a first array of ridges separated from one another by respective recessed regions;

providing a circuit layer overlying the base substrate, the circuit layer comprising a second array of electrical contacts, each of the first array of ridges aligned to only one of the second array of electrical contacts; and pressing the first array of ridges against the second array of electrical contacts, the respective recessed regions permitting a plurality of portions of the circuit layer to bow.

27. The method according to claim 26, further comprising the steps of:

positioning the semiconductor wafer adjacent to the circuit layer, the semiconductor wafer comprising a third array of electrical contacts, the first array of ridges aligned to the third array of electrical contacts;

pressing the second array of electrical contacts towards the third array of electrical contacts;

electrically biasing the second array of electrical contacts; and using the second array of electrical contacts to electrically test the semiconductor wafer.

* * * * *